United States Patent [19]

Ohnishi et al.

[11] Patent Number: 5,407,838
[45] Date of Patent: Apr. 18, 1995

[54] METHOD FOR FABRICATING A SEMICONDUCTOR DEVICE USING IMPLANTATION AND SUBSEQUENT ANNEALING TO ELIMINATE DEFECTS

[75] Inventors: Tetsuya Ohnishi, Ikoma; Kazushi Naruse, Nara, both of Japan

[73] Assignee: Sharp Kabushiki Kaisha, Osaka, Japan

[21] Appl. No.: 196,795

[22] Filed: Feb. 15, 1994

Related U.S. Application Data

[63] Continuation of Ser. No. 909,760, Jul. 7, 1992, abandoned.

[30] Foreign Application Priority Data

Jul. 10, 1991 [JP] Japan ................... 3-169789

[51] Int. Cl.⁶ .......................................... H01L 21/265
[52] U.S. Cl. ....................... 437/25; 437/933; 437/952; 148/DIG. 24
[58] Field of Search .............. 437/24, 25, 247, 933, 437/952, 959; 148/DIG. 3, DIG. 24, DIG. 40, DIG. 34, DIG. 78, DIG. 79

[56] References Cited

U.S. PATENT DOCUMENTS

| | | | |
|---|---|---|---|
| 3,925,106 | 12/1975 | Ku et al. | 437/933 |
| 4,187,125 | 2/1980 | Feist | 437/45 |
| 4,584,026 | 4/1986 | Wu et al. | 148/DIG. 24 |
| 5,015,593 | 5/1991 | Yawata et al. | 437/25 |
| 5,126,278 | 6/1992 | Kodaira | 437/933 |

FOREIGN PATENT DOCUMENTS 0101455  6/1983  Japan .
0059867  3/1984  Japan .

*Primary Examiner*—Brian E. Hearn
*Assistant Examiner*—Chandra Chaudhari
*Attorney, Agent, or Firm*—Nixon & Vanderhye

[57] ABSTRACT

A method for fabricating a semiconductor device including carrying out an ion implantation into a predetermined region of a single-crystal silicon substrate to form therein an amorphized ion-implanted layer according to any one of the methods: (A) implanting an ion of an atom serving as carrier into the predetermined region, followed by implanting an ion of an electrically inert atom or molecule into the region, (B) implanting an ion of an electrically inert atom or molecule in the region, followed by implanting an ion of an atom serving as carrier in the region, and (C) implanting an ion of a molecule in which an atom serving as carrier is bonded to an electrically inert atom; annealing the substrate in an inert atmosphere to crystallize the amorphized ion-implanted layer again; and further annealing the substrate in an oxidizing atmosphere to eliminate defects at the interface of the substrate and the ion implantation layer.

5 Claims, 4 Drawing Sheets

METHOD FOR FABRICATING A SEMICONDUCTOR DEVICE USING IMPLANTATION AND SUBSEQUENT ANNEALING TO ELIMINATE DEFECTS

This is a continuation of application Ser. No. 07/909,760, filed Jul. 7, 1992, now abandoned.

FIELD OF THE INVENTION

The present invention relates to a method for fabricating a semiconductor device, and more particularly, to a method for making a semiconductor which uses an ion implantation and subsequent annealing.

RELATED ART

Ion-implantation technology is generally being used to form transistors in semiconductor devices. The ion-implantation technology includes ion implantation and subsequent annealing.

It has been a conventional method to implant on a single-crystal silicon substrate only ions of a species of atom serving as carrier such as B+ or the like. However, such method suffers disadvantages in that implantation of one species such as B+ in an insufficient dose causes amorphized portions to localize and leaves unamorphized portions to remain in a target region of the substrate, while in contrast implantation at too high a dose amorphizes portions other than the target region undesirably. This results in degradation in electronic characteristics of a transistor.

In order to avoid such disadvantages, Japanese Unexamined Patent Publication No. 101455/1983 proposed to implant P or B simultaneously with or before or after implantation of another species, for example, F, Cl, Si, Ge or the like to satisfactorily amorphize a diffusion layer 32, which is then annealed to recover the crystallinity thereof, as shown in FIGS. 3(a) and 3(b). This Publication, however, lacks a disclosure of specific conditions for annealing following the ion implantation.

According to knowledge of the present inventors, when an ion-implanted layer, or amorphized layer is annealed at a relatively low temperature for a relatively short time, solid phase epitaxial growth takes place from the interface (represented by B—B line in FIG. 3(b)) between the amorphized layer and the single-crystal silicon, and so the crystallinity of the most part of the ion-implanted layer is recovered. However, defects of crystallinity remain at the interface B—B. Although these defects can be eliminated by a further heat treatment at a sufficiently high temperature for a relatively long time, this treatment may redistribute the implanted atoms undesirably. To confine such redistribution to a tolerable degree, time and temperature for the treatment must be strictly selected, resulting in insufficient annealing. Accordingly, the defects still remain at the interface B—B. Such residual defects may cause an increase in inverse leakage current at P-N junction or a short circuit between collector and emitter of a bipolar transistor, resulting in severe degradation in device characteristics.

SUMMARY OF THE INVENTION

The present invention has been accomplished in view of the foregoing, and provides an improved method for fabricating a semiconductor device, by which can be provided a semiconductor device with no defects of crystallinity and assuring highly reliable device characteristics.

Thus, the present invention provides a method for fabricating a semiconductor device comprising the steps of:

carrying out an ion implantation into a predetermined region of a single-crystal silicon substrate to form therein an amorphized ion-implanted layer according to any one of the methods:

(A) implanting an ion of an atom serving as carrier into said predetermined region, followed by implanting an ion of an electrically inert atom or molecule into said region, (B) implanting an ion of an electrically inert atom or molecule in said region, followed by implanting an ion of an atom serving as carrier in said region, and (C) implanting an ion of a molecule in which an atom serving as carrier is bonded to an electrically inert atom;

annealing said substrate in an inert atmosphere to crystallize said amorphized ion-implanted layer again; and further annealing said substrate in an oxidizing atmosphere.

DETAILED DESCRIPTION OF THE PREFERRED EMBODIMENTS

In the present invention, ion implantation is carried out according to any one of the following three methods:

(A) implanting an ion of an atom serving as carrier into a predetermined region of a single-crystal silicon substrate, followed by implanting an ion of an electrically inert atom or molecule into said region;

(B) implanting an ion of an electrically inert atom or molecule into said region of the substrate, followed by implanting an ion of an atom serving as carrier into said region; and (C) implanting into said region an ion of a molecule in which an atom serving as carrier is bonded to an electrically inert atom.

In the method (A) or method (B), examples of the atoms serving as carrier include B, P and the like, while examples of the electrically inert atoms or molecules include F, Si, Cl, Ge, $F_2$, $Cl_2$ and the like. It is desired that the distance that the ion of an electrically inert atom or molecule runs in the substrate be equal to or more than that the ion of an atom serving as carrier does. To this end the ion of an electrically inert atom or molecule is implanted preferably at an acceleration energy of 200 keV or less. The implanted layer is sufficiently amorphized with an implantation dose of $5 \times 10^{14}$ to $2 \times 10^{16}$ ions/cm², preferably $1 \times 10^{15}$ to $1 \times 10^{16}$ ions/cm².

In the method (C), examples of the molecules include $BF_2$, $PCl_2$, $PF_2$ and the like. The implantation is carried out at an acceleration energy of 10 to 150 keV. The implanted layer is sufficiently amorphized with an implantation dose of $2.5 \times 10^{14}$ to $1 \times 10^{16}$ ions/cm², preferably $5 \times 10^{14}$ to $5 \times 10^{15}$ ion/cm².

Figure 2:
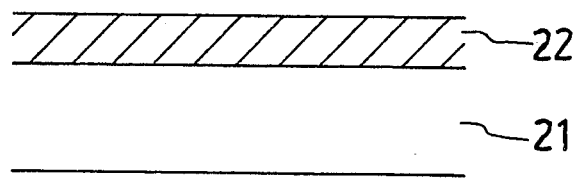
FIGS. 2(a)–2(c) are schematic illustrations for explaining ion implantation and subsequent annealing in the method according to the present invention.
Figure 2:
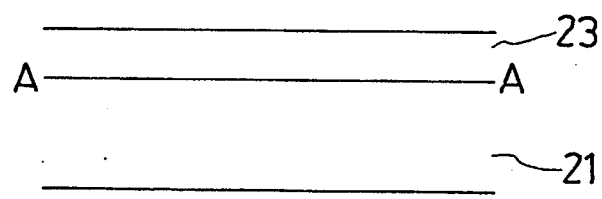
Figure 2:
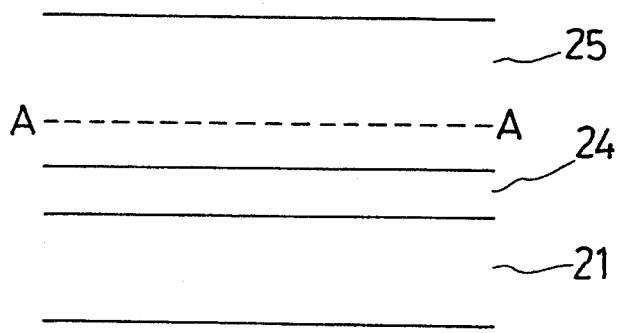
Figure 3A:
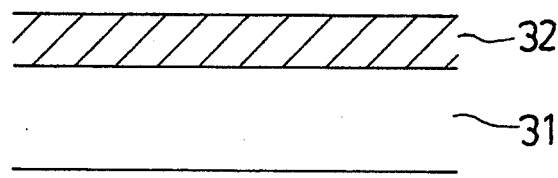
FIGS. 3(a)–3(b) are schematic illustrations for explaining the prior art ion-implantation technology.
Figure 3B:
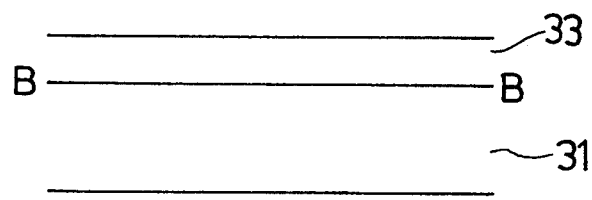

The ion implantation according to any one of the above methods (A), (B) and (C) forms an amorphized ion-implanted layer 22 in the upper portion of the substrate 21 as shown in FIG. 2(a). Such ion implantation can prevent amorphized portions from localizing, and hence only a predetermined region can be amorphized desirably.

After the ion implantation, the substrate is annealed in an inert atmosphere of $N_2$, Ar or a like gas at 600°–950° C., preferably 700°–900° C. for 10–180 minutes. This annealing causes solid phase epitaxial growth from the interface between the amorphized portion (ion-implanted layer) and the single-crystal silicon to recover the crystallinity of most of the ion-implanted layer, forming a diffusion layer 23 shown in FIG. 2(b). Note that a line A—A represents an interface between the amorphized portion and the single-crystal silicon.

However, defects in crystallinity remain at the above interface A—A despite the recovery of the crystallinity of most of the ion-implanted layer. To eliminate the remaining defects, the substrate is further subjected to annealing in an oxidizing atmosphere such as of $H_2O$, $O_2$ or a like gas at 850°–1000° C., preferably 900°–950° C., for 20–300 minutes. This process forms a film oxide on the substrate to a thickness three times larger than the depth of the ion-implanted layer, with silicon of the substrate consumed to a depth beyond the interface A—A. Accordingly, the remaining defects are completely oxidized, while on the other hand the implanted ion is further diffused more deeply because of heat to form a diffusion layer 24 under the film oxide as shown in FIG. 2(c). Thus, such a diffusion layer 24 is defect-free.

EXAMPLE

Henceforth, an example embodying the present invention will be described in detail with reference to the drawings.

FIG. 1 is a schematic representation for illustrating stepwise a fabrication process of a NPN bipolar transistor, wherein a method of the present invention was adopted to form a diffusion layer as a base region.

Figure 1A:
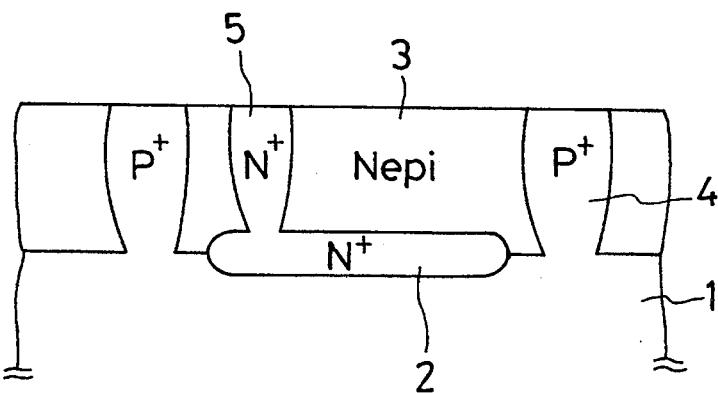
FIGS. 1(a)–1(f) are schematic illustrations for explaining a method according to the present invention.

Referring to FIG. 1(a), a $SiO_2$ film was first grown on a P-type silicon substrate 1. The $SiO_2$ film in a predetermined region was removed to form a window, and arsenic ions as N-type impurity were implanted through the window and heat-diffused to form a N+ buried layer 2 as collector. In turn, the remaining $SiO_2$ film on the substrate 1 was removed, then a phosphorus-doped silicon was epitaxially grown to 15000 Å thick on the substrate surface by chemical vapor deposition (CVD) to form a N-type epitaxial layer 3. Thereafter, boron was selectively diffused to form P+-diffused isolation layers 4, then a N-type impurity (phosphorus) was diffused from the surface of the N-type epitaxial layer 3 down to the N+ buried layer 3 to form a N+ diffusion layer (collector) 5.

Figure 1B:
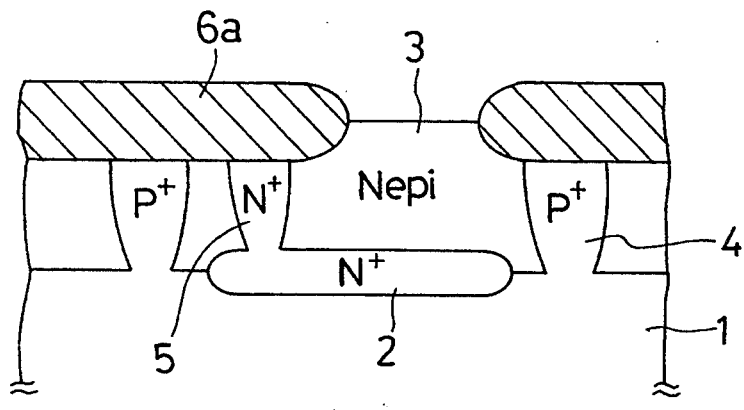

Referring to FIG. 1(b), a film oxide 6a was formed to 3000 Å thick on the substrate surface except a base-emitter formation region by selective oxidation.

Figure 1C:
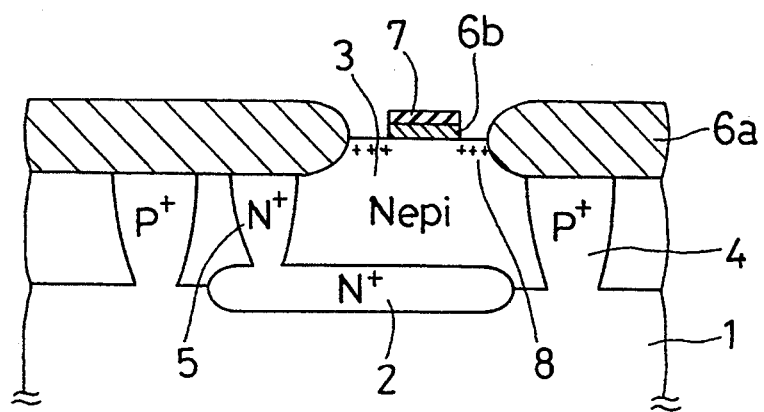

Referring to FIG. 1(c), the substrate surface was then entirely oxidized to form a film oxide 6b to 300 Å thick on the base-emitter formation region, followed by deposition of film nitride 7 on the film oxide 6b. In turn, only the emitter formation region was covered with photoresist, and the film nitride 7 and film oxide 6b on the base formation region were removed by photolithography.

Using the film oxide 6a and the remaining stacked film of the film oxide 6b and film nitride 7 as a mask, ions were implanted into the base formation region to form an ion-implanted layer 8 to about 300 Å deep from the substrate surface under each of the conditions A, B, C and D listed in the following table.

TABLE 1

| Condition | Ion Species | Acceleration Energy (keV) | Dose (ions/cm²) |
|---|---|---|---|
| A | | | |
| 1 | $^{11}B+$ | 7 | 2E15 |
| 2 | $^{19}F+$ | 12 | 4E15 |
| B | | | |
| 1 | $^{19}F+$ | 12 | 4E15 |
| 2 | $^{11}B+$ | 7 | 2E15 |
| C | $^{49}BF_2+$ | 30 | 2E15 |
| D | $^{11}B+$ | 7 | 2E15 |

Note that under condition A, $^{11}B+$ ion was first implanted, followed by $^{19}F+$ ion implantation, while under condition B such implantation order is reversed. In addition, condition D is for conventional ion implantation.

Figure 1D:
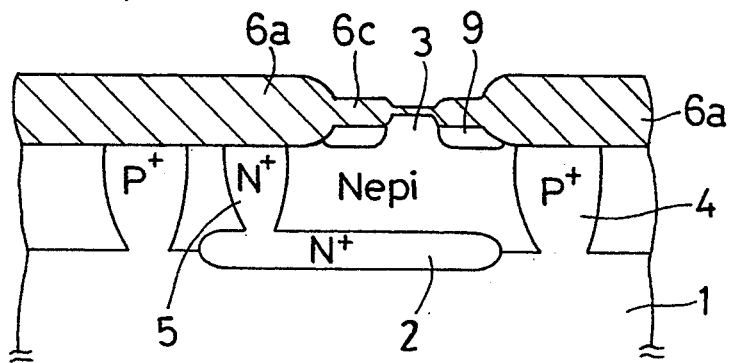

Referring to FIG. 1(d), the substrate 1 thus treated was annealed in an $N_2$ atmosphere at 900° C. for 40 minutes. Subsequently, the substrate 1 was further annealed in a $H_2O$ atmosphere at 900° C. for 30 minutes. This resulted in formation of a film oxide 6c ($SiO_2$) having a thickness of 1000 Å, which was about three times larger than the depth of the ion-implanted layer (amorphized layer). The film nitride 7 on the emitter formation region was then removed.

Figure 1E:
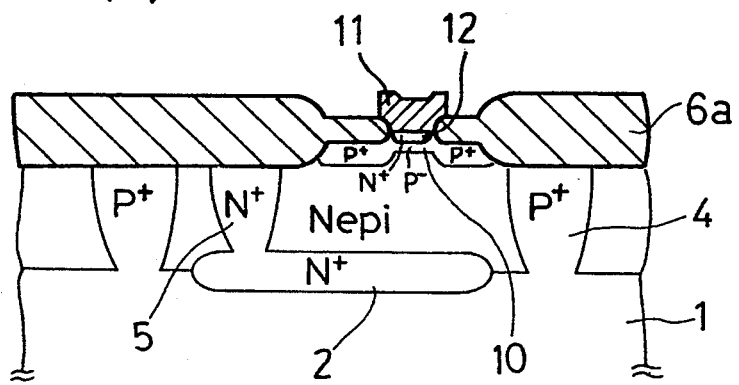

Referring to FIG. 1(e), using the film oxides 6a and 6c as a mask, $^{11}B+$ ions were implanted into the emitter formation region, and then the film oxide 6b on the emitter formation region was removed by etching. Thereafter, As-doped polysilicon 11 was deposited to cover the emitter formation region and annealed to diffuse As therefrom into the emitter formation region thereby forming an N+ emitter region 12 while activating a P− base region existing beneath the emitter region 12.

Figure 1F:
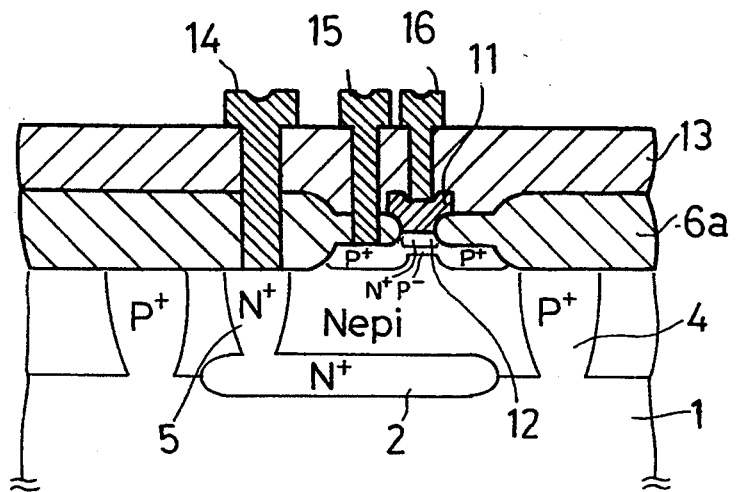

Referring finally to FIG. 1(f), a BPSG film 13 was deposited on the entire substrate surface, contact holes were formed with respect to the collector, base and emitter regions, respectively, and a collector electrode 14, base electrode 15 and emitter electrode 16 were formed for respective contact holes. Thus, an NPN bipolar transistor was completed.

It should be noted that fluorine or a fluoride is particularly favorable as the electrically inert atom or molecule because F is volatile and does not remain in the silicon substrate after annealing in an oxidizing gas atmosphere, not affecting the crystallinity of diffusion region.

The failure rate of devices fabricated according to the above process due to short circuit between the collector and the emitter was remarkably reduced as compared with those fabricated in the conventional process; from 90–100% to 0–5%. Furthermore, the defect density of the base region was also conspicuously reduced; from 50–100/100 $\mu m^2$ to 0–1/100 $\mu m^2$. These results proved good crystallinity of the ion-implanted layer having been annealed.

While only certain presently preferred embodiments have been described in detail, as will be apparent with those familiar with the art, certain changes and modifications can be made without departing from the scope of the invention as defined by the following claims.

What we claim is:

1. A method for fabricating a semiconductor device comprising the steps of:

carrying out an ion implantation with respect to a region of a single-crystal silicon substrate to form therein an amorphized ion-implanted layer according to any one of the methods:

(A) implanting an ion of an atom serving as carrier into said region, followed by implanting an ion of an electrically inert atom or molecule into said region, (B) implanting an ion of an electrically inert atom or molecule in said region, followed by implanting an ion of an atom serving as carrier in said region, and (C) implanting an ion of a molecule in which an atom serving as carrier is bonded to an electrically inert atom;

annealing said substrate in an inert atmosphere to crystallize said amorphized ion-implanted layer again; and removing crystal defects remaining subsequent to said annealing by further annealing said substrate in an oxidizing atmosphere so that an oxide film is formed to a thickness substantially three times thicker than the depth of said ion implantation layer and extending into the substrate beyond an interface of said ion implantation layer and said substrate.

2. A method as set forth in claim 1, wherein said annealing in an inert atmosphere is carried out at a temperature of 600° to 950° C. in a nitrogen or argon gas atmosphere.

3. A method as set forth in claim 1, wherein said further annealing in an oxidizing atmosphere is carried out at a temperature of 850° to 1000° C. in a water vapor or oxygen gas atmosphere.

4. A method as set forth in claim 1 wherein said ion implanted layer is about 300 Å deep from the substrate surface and said oxide film is about 1000 Å thick.

5. A method as set forth in claim 4 wherein the fabricated semiconductor device is a transistor.

* * * * *